United States Patent
Chun et al.

(10) Patent No.: US 7,536,630 B2
(45) Date of Patent: May 19, 2009

(54) RECONFIGURABLE VITERBI/TURBO DECODER

(75) Inventors: Anthony L. Chun, Los Altos, CA (US); Inching Chen, Portland, OR (US); Vicki W. Tsai, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 593 days.

(21) Appl. No.: 10/936,372

(22) Filed: Sep. 8, 2004

(65) Prior Publication Data
US 2005/0034051 A1  Feb. 10, 2005

Related U.S. Application Data

(63) Continuation-in-part of application No. 10/457,592, filed on Jun. 10, 2003.

(51) Int. Cl.
H03M 13/45 (2006.01)
H03M 13/35 (2006.01)

(52) U.S. Cl. .................. 714/790; 714/794; 714/795

(58) Field of Classification Search ........... 714/794, 714/795, 790
See application file for complete search history.

(56) References Cited

U.S. PATENT DOCUMENTS

| | | | | | |
|---|---|---|---|---|---|
| 4,433,331 A | * | 2/1984 | Kollaritsch | ................. | 326/40 |
| 4,876,466 A | * | 10/1989 | Kondou et al. | ................ | 326/38 |
| 5,363,319 A | * | 11/1994 | Okuda | ......................... | 703/15 |
| 5,781,031 A | * | 7/1998 | Bertin et al. | ................. | 326/39 |
| 6,205,187 B1 | * | 3/2001 | Westfall | ..................... | 375/341 |
| 6,477,680 B2 | * | 11/2002 | Mujtaba | ..................... | 714/795 |
| 6,690,750 B1 | * | 2/2004 | Hocevar et al. | ............. | 375/341 |
| 6,823,505 B1 | * | 11/2004 | Dowling | ..................... | 717/140 |
| 6,865,710 B2 | * | 3/2005 | Bickerstaff et al. | ......... | 714/796 |
| 6,901,118 B2 | * | 5/2005 | Hocevar et al. | ............. | 375/341 |
| 7,020,223 B2 | * | 3/2006 | Vasquez | ..................... | 375/341 |
| 7,046,747 B2 | * | 5/2006 | Vasquez | ..................... | 375/341 |
| 2004/0255230 A1 | * | 12/2004 | Chen et al. | ................... | 714/796 |
| 2006/0003757 A1 | * | 1/2006 | Subramanian et al. | ...... | 455/418 |

OTHER PUBLICATIONS

Chaikalis, C., et al., "Reconfiguration Between Soft Output Viterbi and Log Maximum A Posteriori Decoding Algorithms" 3G Mobile Communication Technologies, 2000, First International, Conference Publication No. 471, Mar. 2000, pp. 316-320.*

Bickerstaff, M., et al., "A Unified Turbo/Viterbi Channel Decoder for 3GPP Mobile Wireless in 0.18-um CMOS" IEEE Journal of Solid-State Circuits, vol. 37, No. 11, Nov. 2002, pp. 1555-1564.*

Cavallaro, J., et al., "Viterbo: A Recongfigurable Architecture for Viterbi and Turbo Decoding" Acoustics, Speech, and Signal Processing, 2003, Proceeding IEEE International Conference, Apr. 2003, pp. 497-500.*

* cited by examiner

*Primary Examiner*—Stephen M Baker
(74) *Attorney, Agent, or Firm*—The Law Offices of John C. Scott, LLC; John C. Scott

(57) ABSTRACT

A reconfigurable decoder is capable of performing both Viterbi decoding and turbo decoding. The reconfigurable decoder may be repeatedly reconfigured to work with any of a number of different convolutional or turbo coding schemes. In at least one embodiment, the reconfigurable decoder is capable of automatically reconfiguring itself based on a present signal environment about a communication device carrying the decoder.

18 Claims, 4 Drawing Sheets

RECONFIGURABLE VITERBI/TURBO DECODER

This application is a continuation-in-part of U.S. patent application Ser. No. 10/457,592, filed Jun. 10, 2003, which is hereby incorporated by reference.

TECHNICAL FIELD

The invention relates generally to forward error correction (FEC) codes and, more particularly, to techniques and structures for performing Viterbi and turbo FEC decoding.

DETAILED DESCRIPTION

Figure 1:
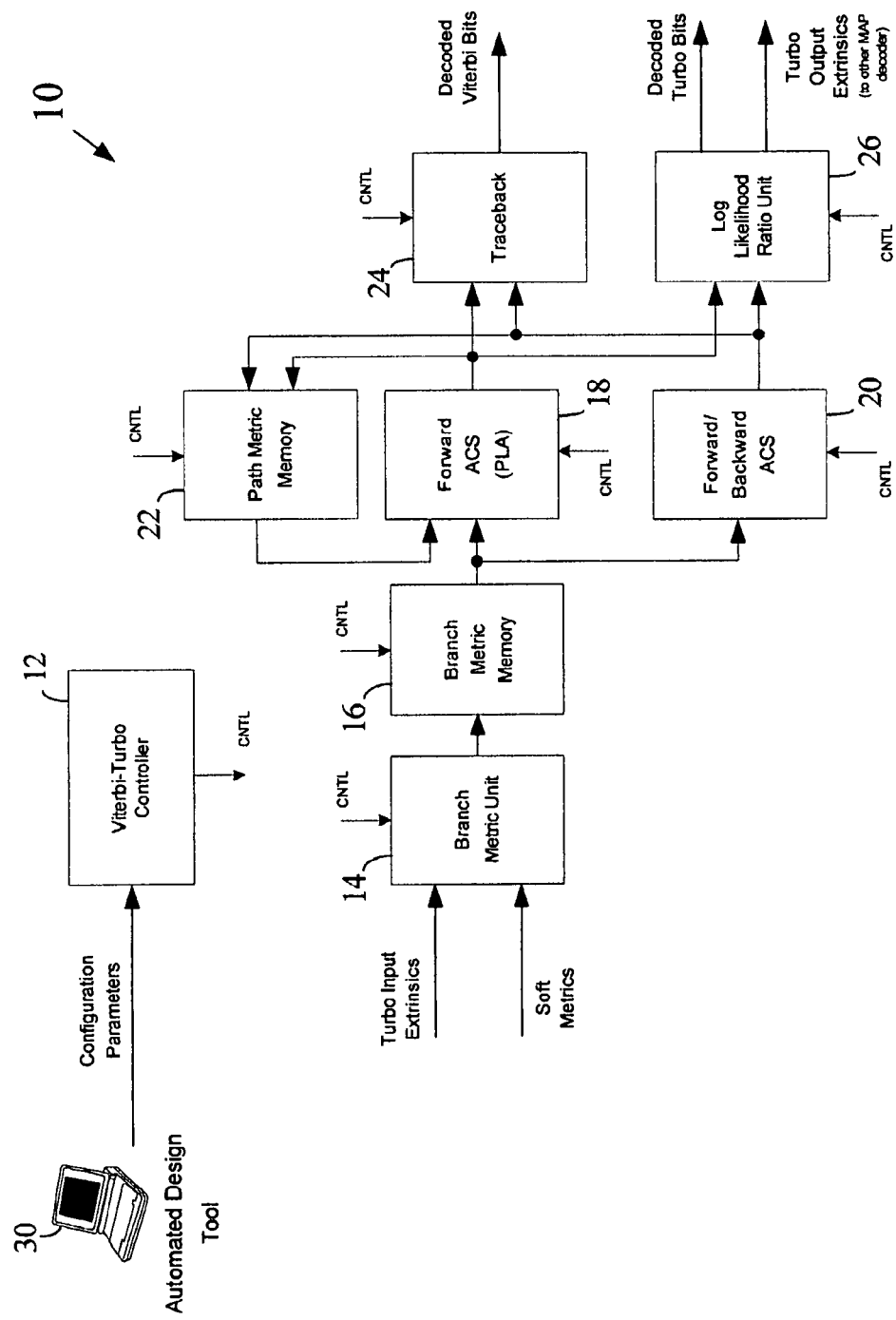
FIG. 1 is a block diagram illustrating an example reconfigurable decoder in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram illustrating an example reconfigurable decoder 10 in accordance with an embodiment of the present invention. The reconfigurable decoder 10 may be used within, for example, a communication device to process forward error correction (FEC) coded information associated with one or more corresponding wireless and/or wired communication systems. The reconfigurable decoder 10 is capable of performing both Viterbi decoding and turbo decoding. As will be described in greater detail, the reconfigurable decoder 10 is capable of being repeatedly reconfigured to work with any number of different convolutional and/or turbo coding schemes. In at least one embodiment, the reconfigurable decoder 10 is capable of automatically reconfiguring itself based on a present signal environment about a communication device carrying the decoder 10. The reconfigurable decoder 10 may also be capable of being updated from time to time to work with new coding schemes.

In at least one embodiment, as illustrated in FIG. 1, processing elements that are common to both Viterbi and turbo decoders are shared within the reconfigurable decoder 10 to be used during both Viterbi and turbo decoding operations. As will be appreciated, such component sharing can significantly reduce the area needed to implement the reconfigurable decoder 10. In other embodiments, separate structures may be used to perform the Viterbi and turbo decoding.

As illustrated in FIG. 1, the reconfigurable decoder 10 may include one or more of: a Viterbi-turbo controller 12, a branch metric unit 14, a branch metric memory 16, a forward add-compare-select (ACS) 18, a forward/backward ACS 20, a path metric memory 22, a traceback unit 24, and a log likelihood ratio (LLR) unit 26. As described above, the reconfigurable decoder 10 is capable of performing both Viterbi decoding and turbo decoding. The type of decoding performed by the reconfigurable decoder 10 at any particular time will depend on how the various elements of the decoder 10 are configured at that time. The Viterbi-turbo controller 12 is capable of reconfiguring the reconfigurable decoder 10 to operate in accordance with a particular convolutional or turbo coding scheme by transferring appropriate configuration information (e.g., configuration parameters and/or software) to the corresponding processing elements of the decoder 10. For example, if it is desired that the reconfigurable decoder 10 operate as a Viterbi decoder to decode information coded with a particular convolutional code (e.g., a convolutional code having a constraint length (k) of 3 and a rate of ½), then the controller 12 may transfer configuration information corresponding to this coding scheme to one or more of: the branch metric unit 14, the branch metric memory 16, the forward ACS 18, the forward/backward ACS 20, the path metric memory 22, and the traceback unit 24 to configure the decoder 10 for the coding scheme. The LLR unit 26 will not typically be used during Viterbi decoding and, therefore, may be temporarily disabled by the Viterbi-turbo controller 12.

If it is desired that the reconfigurable decoder 10 operate as a particular type of turbo decoder, then the Viterbi-turbo controller 12 may transfer corresponding configuration information to one or more of: the branch metric unit 14, the branch metric memory 16, the forward ACS 18, the forward/backward ACS 20, the path metric memory 22, and the LLR unit 26. During turbo decoding, the Viterbi-turbo controller 12 may temporarily disable the traceback unit 24 as this type of functionality is not typically required during turbo decoding. When operating as a turbo decoder, the reconfigurable decoder 10 performs one-half of a log MAP iteration. To process multiple iterations, data may be interleaved and recirculated through the same decoder module or multiple decoder modules may be used.

In at least one embodiment, the Viterbi-turbo controller 12 will have an associated data storage unit (e.g., a semiconductor memory, a disk drive, etc.) in which configuration information associated with a number of different coding schemes is stored and indexed. When the Viterbi-turbo controller 12 desires to implement a particular type of decoder, it may simply retrieve the corresponding configuration information from the data storage unit and deliver it to the corresponding processing elements.

Figure 2:
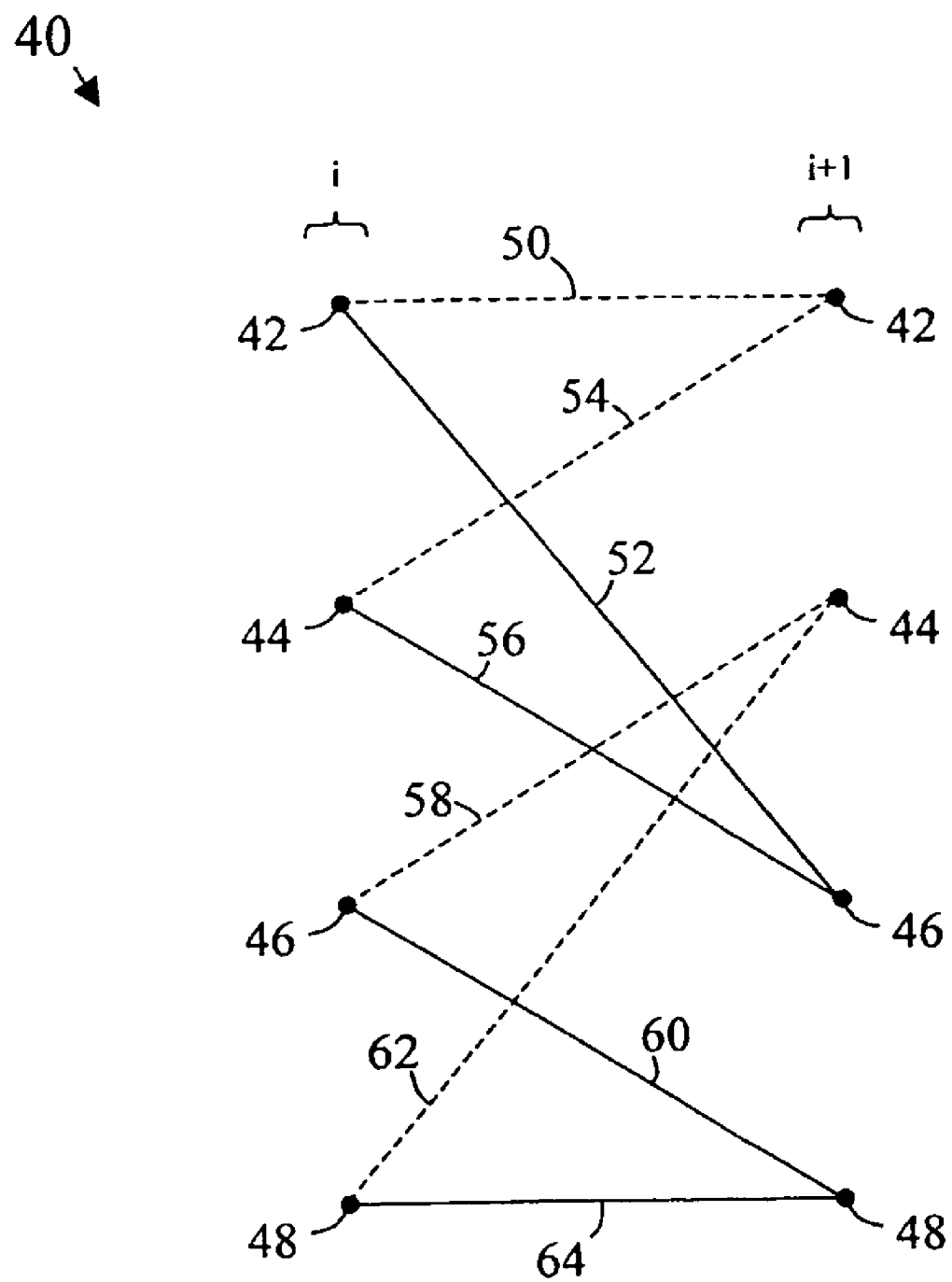
FIG. 2 illustrates a portion of a trellis diagram that may be used by a Viterbi decoder.

As is well known in the art, the operation of both Viterbi decoders and turbo decoders may be represented using trellis diagrams. FIG. 2 illustrates a portion of a trellis diagram 40 that may be implemented within a Viterbi decoder. A full trellis diagram may include many repetitions of the trellis portion 40 of FIG. 2. As illustrated, the trellis portion 40 includes a current stage i and a next stage i+1. Any number of additional stages may also be present within the trellis. Each stage of the trellis portion 40 includes a number of trellis states (i.e., first state 42, second state 44, third state 46, and fourth state 48). Each state within the current stage i of the trellis portion 40 is coupled to at least one state within the next stage i+1 by a "branch." For example, first state 42 within stage i is coupled to first state 42 within stage i+1 by branch 50, first state 42 within stage i is coupled to third state 46 within stage i+1 by branch 52, second state 44 within stage i is coupled to first state 42 within stage i+1 by branch 54, second state 44 within stage i is coupled to third state 46 within stage i+1 by branch 56, and so on.

During Viterbi processing, a decoder will typically traverse through a full trellis to identify a path through the trellis that most likely represents a transmitted data stream. The decoder may do this by maintaining a path metric for multiple paths through the trellis that represents an accumulated error. At the end of the trellis, the path with the lowest path metric (i.e., the lowest error sum) may be deemed the most likely path. For each transition between trellis stages (e.g., from stage i to stage i+1 in FIG. 2), the Viterbi decoder will seek to generate an updated path metric for each state (or node) 42, 44, 46, 48 in the new stage (e.g., stage i+1). To generate an updated path metric for a particular state in the new stage, the decoder will add a path metric associated with a state in the previous stage (e.g., stage i) to a branch metric for the branch leading from the state in the previous stage to the state in the new stage. For example, with reference to FIG. 2, to generate an updated path metric for third state 46 in stage i+1, the decoder may add a branch metric for branch 52 to a path metric associated with state 42 within stage i. However, as shown in FIG. 2, there is another branch 56 that also leads to state 46 within stage i+1. Thus, the decoder will also add a branch metric for branch 56 to a path metric associated with state 44 of stage i to generate another updated path metric for state 46 in stage i+1.

To reduce the number of paths that are being tracked in the decoder, only one of these updated path metrics will be retained for state 46 in stage i+1. That is, the decoder may "select" the lower of the two updated path metrics to be retained (as this represents the lower error sum). This may be referred to as an "add-compare-select" or ACS operation. A similar procedure may be followed to generate an updated path metric for the other states 42, 44, 48 in stage i+1. This technique may then be repeated for each successive stage of the trellis until an end of the trellis is reached. As is well known in the art, similar trellis based techniques may be used in a turbo decoder, although during turbo decoding one may traverse in both forward and backward directions through a corresponding trellis.

The branch metrics that are used in the above-described process represent incremental error values that are associated with each respective branch based on a current input value to the branch metric unit. For example, with reference to FIG. 2, in one possible implementation, the branch 52 between first state 42 in stage i and third state 46 in stage i+1 may represent the receipt of a symbol "00." If a state "01" is actually received, then a branch metric for the branch 52 may be calculated as an error between "00" and "01." The error may be calculated in any of a number of different ways. For example, in one approach, a Hamming distance may be calculated between the two values. In another embodiment, a squared Euclidean distance may be calculated. Other measures are also possible. A similar approach may be used if soft metrics are input to the branch metric unit.

Referring back to FIG. 1, the branch metric unit 14 is operative for calculating branch metrics for a current decoder configuration based on information received at an input thereof. In different embodiments, different types of information may be input to the branch metric unit 14. In the illustrated embodiment, for example, the branch metric unit 14 receives a different type of information depending upon whether a Viterbi decoder or a turbo decoder is presently being implemented. If Viterbi decoding is being performed, corresponding soft metrics may be received at the input of the branch metric unit 14. These soft metrics may represent, for example, the quantized baseband waveform received from the demodulator and are proportional to the reliability of the received symbols being a "0" or a "1." If turbo decoding is being performed, turbo input extrinsics may be received by the branch metric unit 14. These turbo input extrinsics may represent, for example, the a priori knowledge of whether the received symbols are a "0" or "1." These extrinsics may be calculated by a previous turbo iteration. In other embodiments, other types of information (e.g., received data symbols, etc.) may be received by the branch metric unit 14. The branch metric memory 16 is operative for storing the branch metrics calculated by the branch metric unit 14. These branch metrics may then be made available to the forward ACS 18 and the forward/backward ACS 20 for use in, for example, updating path metrics.

The forward ACS 18 is operative for performing ACS operations as described above. That is, for each state in a trellis stage, the forward ACS 18 may add a branch metric to a previous path metric for each branch in the trellis coming into the trellis state. Thus, if there are two branches coming into a particular trellis state, the forward ACS 18 may add a branch metric associated with one of the two branches to a corresponding path metric to calculate a first updated path metric and add a branch metric associated with the other branch to a corresponding path metric to calculate a second updated path metric. The forward ACS 18 may then select one of the updated path metrics to survive (i.e., the lower updated path metric). The forward ACS 18 may include multiple independent ACS units to perform the ACS function for the different states (or nodes) of the trellis (e.g., in one implementation, the forward ACS 18 includes 8 ACS units).

The forward/backward ACS 20 may operate as either a forward ACS or a backward ACS, based on the current configuration. When the reconfigurable decoder 10 is being used as a Viterbi decoder, the forward/backward ACS 20 may be configured as a second forward ACS that can share some of the processing load with the first forward ACS 18. In such a case, the forward/backward ACS 20 may operate in substantially the same manner as the forward ACS 18 (as described above). When the reconfigurable decoder 10 is being used as a turbo decoder, on the other hand, the forward/backward ACS 20 may be configured to operate in a backward direction through the trellis, as is typically required in a turbo decoder. As with the forward ACS 18, the forward/backward ACS 20 may include multiple independent ACS units to perform the ACS functions thereof. In at least one implementation, the forward/backward ACS 20 includes 8 ACS units (although any number may be used).

Depending on the code constraint length that the reconfigurable decoder 10 is presently configured for, multiple iterations through the forward ACS 18 and/or the forward/backward ACS 20 may be required for each stage of the trellis. For example, if a convolutional code having a trellis with 256 states per stage is being implemented, and the forward ACS 18 and the forward/backward ACS 20 each have 8 ACS units (for a total of 16), then 16 iterations may be required to process one stage of the trellis. The results of each iteration may be stored in the path metric memory 22 for later use.

The path metric memory 22 stores the path metrics selected by the forward ACS 18 and the forward/backward ACS 20 for each trellis state. The path metrics stored in the path metric memory 22 are also made available to the forward ACS 18 (and possibly the forward/backward ACS 20) for use in generating updated path metrics for a next trellis stage (i.e., using a current set of branch metrics from the branch metric memory 16). Any type of digital data storage device may be used for the branch metric memory 16 and the path metric memory 22.

As described previously, the traceback unit 24 may only be used when the reconfigurable decoder 10 is configured as a Viterbi decoder. The traceback unit 24 stores state information about a number of previous stages processed by the forward ACS 18 and the forward/backward ACS 20. The traceback unit 24 uses this information to trace back through the trellis to determine the most likely path (i.e., the path most likely to represent the data originally encoded by an associated convolutional encoder). Once the most likely path has been identified, the traceback unit 24 may work forward through the identified path to determine the input bits that correspond to each transition in the path. These bits may then be output by the traceback unit 24 as decoded Viterbi bits. In at least one embodiment, a one pointer traceback algorithm is used (although other techniques/structures may alternatively be used).

The LLR unit 26 may only be used when the reconfigurable decoder 10 is configured as a turbo decoder. The LLR unit 26 computes the "log likelihood ratio" of decoded bits using the computed forward path metrics, backward path metrics, and branch metrics. These log likelihood ratios are computed for each bit and are used to make a decision on whether the bit is a "0 or a "1." The LLRs may also be used to compute extrinsics for the next turbo iteration.

Each different coding scheme that is supported by a reconfigurable decoder in accordance with the present invention may have a different trellis diagram than the other supported coding schemes. The trellis diagrams may vary in, for example, the number of trellis states per stage, the number of trellis stages, the branch relationships between stages, and/or in other ways. The configuration information that is delivered to the processing elements of the decoder 10 during reconfiguration may, among other things, change the structure of the trellis that is being implemented by the reconfigurable decoder 10. For example, in various embodiments, the following types of information may be stored for each supported coding scheme for use during reconfiguration: information regarding the routing of branch metrics to ACS units, information regarding the routing of path metrics to ACS units, information regarding the recreation of a state sequence using traceback bits, information regarding the number of inputs into each ACS (e.g., radix-2 or radix 4 ACS), information regarding the code rate k/n, information regarding the puncturing pattern that is used for a punctured code, information regarding the carrier modulation type and symbol-to-bit map, and/or information regarding the number of quantization bits on the input soft decisions. Other types of information may also, or alternatively, be stored.

In at least one embodiment of the present invention, some or all of the processing elements of the reconfigurable decoder 10 may be implemented using reconfigurable hardware. This can include, for example, field programmable gate arrays (FPGAs), programmable logic arrays (PLAs), programmable array logic (PAL), generic array logic (GAL), and/or others. In at least one implementation, the decoder architecture of FIG. 1 is used and the branch metric unit 14, the branch metric memory 16, the forward ACS 18, the forward/backward ACS 20, the path metric memory 22, the traceback unit 24, and the LLR unit 26 are all implemented using PLAs. When using reconfigurable hardware, processing changes may be accomplished by delivering corresponding configuration parameters to the various processing elements. Configuration parameters may include parameters such as, for example, PLA fusemaps, multiplexer settings, lookup tables (LUTs), and/or others. In at least one embodiment of the present invention, a combination of reconfigurable hardware and software-based processors are used within a reconfigurable decoder.

As described above, in at least one embodiment, the reconfigurable decoder 10 is capable of automatically reconfiguring itself based on a present signal environment about a communication device carrying the decoder 10. For example, a wireless receiver (or some other structure) within the communication device may detect the presence of a wireless access point following a predetermined wireless networking protocol (e.g., a wireless access point following the IEEE 802.11a wireless networking standard, etc.) transmitting in the surrounding environment. The receiver may deliver this information to the Viterbi-turbo controller 12 which then retrieves corresponding configuration parameters (and/or software) from a data storage unit and delivers them to the elements of the decoder 10. The decoder 10 may then be used to process communications from the detected wireless access point. At a later time, the same receiver (or a different receiver) within the communication device may detect the presence of, for example, a cellular base station following a predetermined wireless cellular standard (e.g., wideband code division multiple access (WCDMA), etc.). This new information may be transferred to the Viterbi-turbo controller 12 and new configuration parameters may be delivered to the processing elements of the decoder 10. Sometimes a single protocol may define multiple corresponding FEC decoding schemes. For example, the IEEE 802.11a wireless networking standard may utilize a convolutional FEC code having a constraint length of 7 and a rate of either ½, ⅔, or ¾. In such a case, the particular code that is being used may have to be specified by, for example, a field within the header of the received packet or signaled via a control channel.

Referring back to FIG. 1, in at least one embodiment of the present invention, a rate matching unit may be implemented within the reconfigurable decoder 10 to perform a rate matching function for the various protocols and standards supported by the decoder 10. The rate matching unit may be inserted, for example, directly in front of the branch metric unit 14 (although other locations are also possible). Some examples of rate matching structures that may be incorporated into a reconfigurable decoder in accordance with the present invention are disclosed in co-pending U.S. patent application Ser. No. 10/612,760, filed Jun. 30, 2003, which is hereby incorporated by reference. Other rate matching approaches may alternatively be used.

In a typical implementation, a reconfigurable decoder in accordance with the present invention will support a finite number of predetermined protocols and/or standards (wireless and/or wired). In at least one embodiment, a reconfigurable decoder is provided that is capable of being reprogrammed in-situ by an end user to work with additional or new codes/protocols. An automated design tool 30 (see FIG. 1) may be made available that will allow, for example, configuration parameter sets to be developed for use with new protocols. In one approach, for example, a designer enters a diagram of a desired code trellis into the automated design tool 30 and the tool, taking into consideration the hardware constraints, will (a) verify that the desired decoder is realizable using the available hardware, (b) automatically generate the configuration parameters for the desired decoder when the decoder is realizable, and (c) create the appropriate bit files containing fuse maps and/or LUT content to configure each configurable element. The configuration parameter sets may then be made available to end users for entry into corresponding communication devices.

In one possible scenario, for example, a company that manufactures cellular telephones that include a reconfigurable decoder in accordance with the present invention may occasionally utilize the automated design tool to develop configuration parameter sets that allow their cellular telephones to work with new cellular standards. These configuration parameter sets may then be offered to end users of this company's cellular telephones to expand the capabilities of the telephones. This service may be performed, for example, as a courtesy to the customers, for a nominal fee, for a recurring monthly service charge, etc. The configuration parameters may be programmed into the cellular telephone at a point of sale (POS) location or they may be transferred to the end user (e.g., on a disk or other storage medium, via the Internet or other networking medium, or in some other manner) for entry by the end user.

Some protocols/codes for which configuration information may be made available for a reconfigurable decoder include, for example, (a) a constraint length 9, rate ½ code for use with third generation (3G) cellular systems, (b) a constraint length 9, rate ⅓ code for use with 3G cellular systems, (c) constraint length 7, rate ½, ⅔, ¾ codes for use with IEEE 802.11a systems, (d) codes for use with IEEE 802.11g, (e) codes for use with asymmetric digital subscriber line (ADSL) or very high bit rate digital subscriber line (VDSL) standards, (f) codes for use with Advanced Television Systems Committee (ATSC) standards, (g) codes for use with the digital video broadcasting (DVB) standards (e.g., DVB-S, DVB-T, etc.), (h) a constraint length 5, rate ½ code for use with the general packet radio services (GPRS) standard, (i) a rate ⅓, 8-state turbo code that is used in 3G cellular systems, and/or others.

Figure 3:
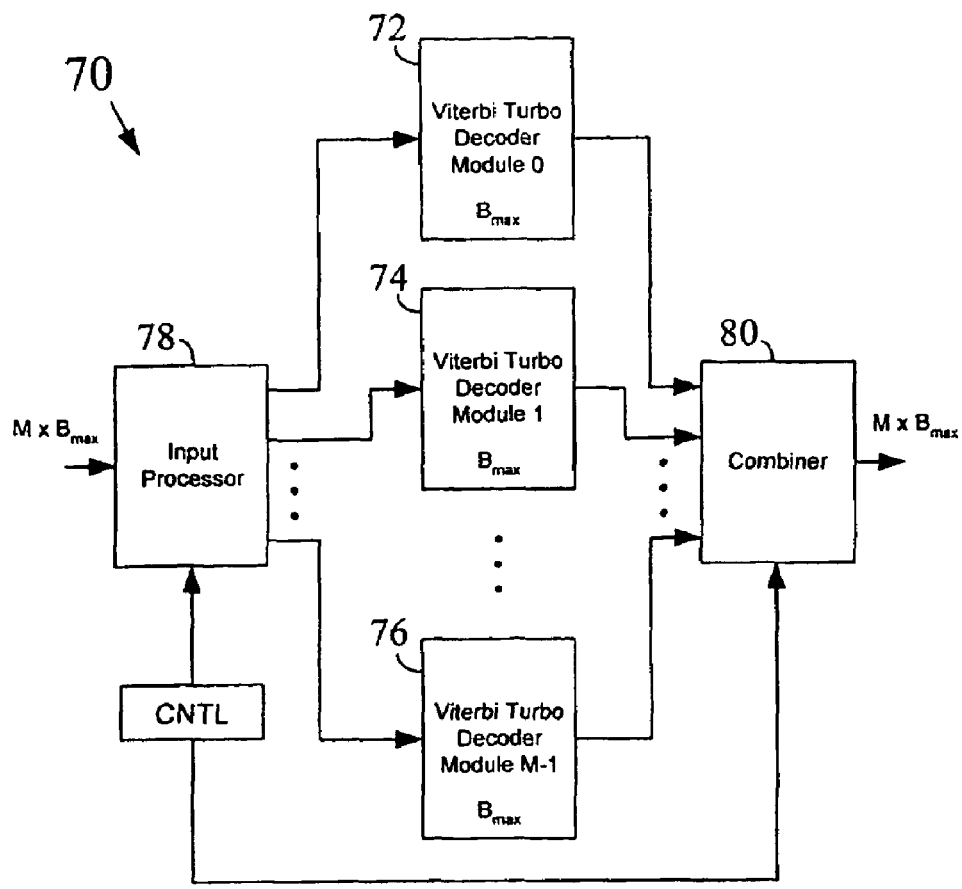
FIG. 3 is a block diagram illustrating an example decoder scaling scheme in accordance with an embodiment of the present invention.

In at least one embodiment, a reconfigurable decoder is provided that is scaleable. That is, multiple decoder modules may be implemented in parallel to process data at higher data rates. FIG. 3 is a block diagram illustrating such an arrangement. As illustrated, a higher data rate decoding system 70 may be achieved by operating two or more reconfigurable decoder modules 72, 74, 76 in parallel. The reconfigurable decoder modules 72, 74, 76 may each utilize, for example, the decoder architecture illustrated in FIG. 1 (or some other architecture). In one possible approach, a single Viterbi-turbo controller may be provided to control/reconfigure all of the reconfigurable decoder modules within the higher data rate decoding system 70 (although, in other embodiments, each decoder module may have its own Viterbi-turbo controller). An input processor 78 may be provided to, among other things, perform segmentation on an incoming data stream to divide the data stream amongst the multiple decoder modules 72, 74, 76. Likewise, a combiner 80 may be provided to reassemble the outputs of the decoder modules 72, 74, 76 into a single stream after decoding. As shown, the input processor 78 and the combiner 80 may operate under common control. When turbo decoding is being performed, the input processor 78 may also perform data permutations (interleaving) on the input data stream before segmentation is carried out. These data permutations may be performed to improve the error correction performance of the turbo code.

Figure 4:
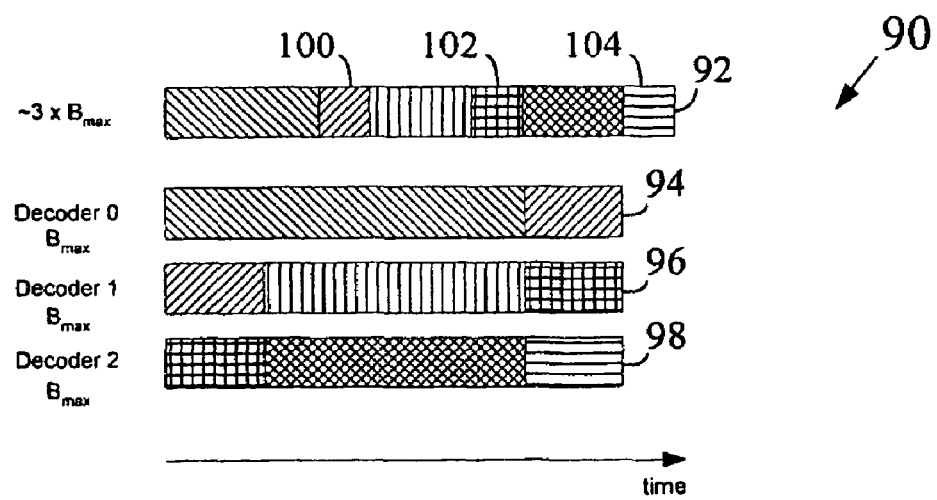
FIG. 4 is a timing diagram illustrating an example segmentation arrangement in accordance with an embodiment of the present invention.

The segmentation and reassembly process will typically have some overhead associated with it. Thus, the data rate that is achievable by using scaling may not be the maximum data rate achievable by a single decoder module ($B_{max}$) multiplied by the number of modules. In one approach, the input processor 78 may allow some overlap in the data that is sent to the different decoder modules 72, 74, 76. This overlap may be needed to compensate for the unreliability of the traceback output at the end of a data block. The traceback unit 24 makes the decisions on the decoded bits using the stored decisions at each node and at each stage of the trellis. Typically, the surviving trellis paths merge after T trellis states, where T is dependent upon the code rate and trellis size (for example, for the 64 state, rate ½ code, T may be on the order of 35 stages). Until these T stages are processed, the decoded bits may not be reliable. For a block of N bits, an additional T bits of overlap from the next block are processed (for a total of N+T) so that all N decoded bits are reliable. FIG. 4 is a timing diagram illustrating an example segmentation arrangement 90 in accordance with an embodiment of the present invention for a three decoder module scaling configuration. The first signal 92 in FIG. 4 represents the input stream of an input processor (e.g., input processor 78 of FIG. 3). The second, third, and fourth signals 94, 96, 98 represent the segmented data that is directed to the three decoder modules (e.g., modules 72, 74, and 76 in FIG. 3). As shown, there is an overlap 100, 102, 104 between the data that is delivered to the three decoder modules.

Figure 5:
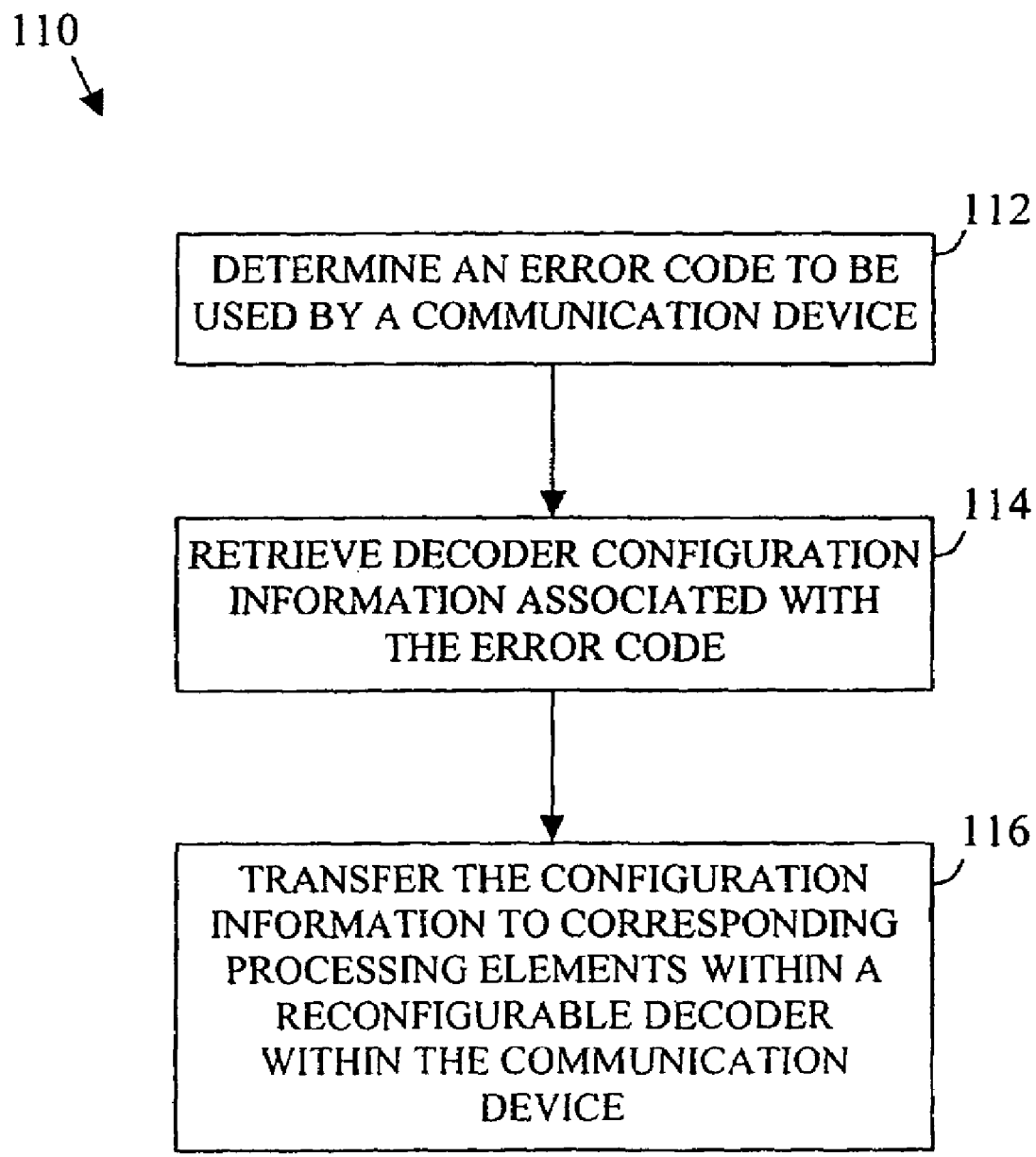
FIG. 5 is a flowchart illustrating an example method for use in reconfiguring a reconfigurable decoder within a communication device in accordance with an embodiment of the present invention.

FIG. 5 is a flowchart illustrating an example method 110 for use in reconfiguring a reconfigurable FEC decoder within a communication device in accordance with an embodiment of the present invention. First, an error correction code to be used by the communication device is determined (block 112). This information may be obtained from, for example, a wireless or wired receiver (or other structure) within the communication device that senses signals having a predetermined type (or from a predetermined source) in an environment about the communication device. In another possible technique, a remote transmitter may use a control channel to transmit information to the communication device that is indicative of an error correction code that is being used to generate transmit signals. In another technique, a received packet may include a header portion that identifies a code used to encode data within the packet. After receiving the packet, the communication device may simply read the header portion to determine the error correction code. Other techniques for determining an error correction code to be used by a communication device may alternatively be used.

Configuration information associated with the error correction code is subsequently retrieved from a data storage unit (e.g., a disk drive, a semiconductor memory, etc.) (block 114). The configuration information is then delivered to the corresponding processing elements of the reconfigurable decoder within the communication device to reconfigure the decoder to process the error correction code (block 116). As described above, depending upon a current configuration, the reconfigurable decoder may perform Viterbi decoding and turbo decoding. The type of configuration information that is retrieved and delivered to the processing elements will depend upon the type of processing elements that are present within the reconfigurable decoder. For example, if reconfigurable hardware is used, then some or all of the configuration information may be configuration parameters (e.g., PLA fusemaps, multiplexer settings, lookup tables (LUTs), etc.). If software-based processing elements are present, then some or all of the configuration information may include software programs, routines, and/or modules. When both reconfigurable hardware and software-based processing elements are used, then both types of configuration information may be retrieved and transferred to the corresponding processing elements.

A reconfigurable decoder in accordance with the present invention may be used in a wide variety of different communication devices, including wired communication devices, wireless communication devices, and devices that are capable of both wireless and wired communication. Such devices may include, for example, cellular telephones, laptop, desktop, palmtop, and tablet computers having wireless networking capabilities, wireless network interface modules (e.g., wireless network interface cards (NICs), etc.), wired network interface modules, wireless routers, wireless access points, network gateways, cable modems, satellite receives, cellular base stations, WiFi access points, WiMax access points, and/or others. A reconfigurable decoder in accordance with the present invention may also be used in data storage applications (e.g., within a disk drive, a memory, etc.). In at least one embodiment, a reconfigurable decoder is coupled to the output of a wireless receiver within a wireless communication device. The wireless receiver may be connected to one or more antennas to facilitate the reception of wireless signals. Any type of antenna(s) may be used including, for example, dipoles, patches, helical antennas, antenna arrays, and/or others, including combinations of the above. Other applications for a reconfigurable decoder in accordance with the present invention also exist.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A reconfigurable decoder comprising:
   a plurality of decoder processing elements; and
   a Viterbi-turbo controller to deliver configuration information to said plurality of decoder processing elements to achieve a desired decoder type;
   wherein said reconfigurable decoder can emulate one or more Viterbi decoder types and one or more turbo decoder types based on a current configuration;
   wherein said configuration information includes parameters to control routing of branch metrics to individual ACS units and parameters to describe a predetermined puncture pattern.

2. The reconfigurable decoder of claim 1, wherein:
   said Viterbi-turbo controller has an associated data storage unit to store configuration information for a plurality of different decoder types.

3. The reconfigurable decoder of claim 1, wherein:
   said plurality of decoder processing elements are implemented using reconfigurable hardware.

4. The reconfigurable decoder of claim 1, wherein:
   said plurality of decoder processing elements includes at least one programmable logic array (PLA).

5. The reconfigurable decoder of claim 1, wherein:
   said configuration information includes parameters to control routing of path metrics to individual ACS units.

6. The reconfigurable decoder of claim 1, wherein:
   said configuration information includes parameters to define recreation of state sequences using traceback bits.

7. The reconfigurable decoder of claim 1, wherein:
   said desired decoder type depends upon a signal environment about said reconfigurable decoder.

8. The reconfigurable decoder of claim 1, wherein:
   said plurality of decoder processing elements includes at least one forward/backward ACS, said at least one forward/backward ACS to be configured as a forward ACS when said reconfigurable decoder is emulating a Viterbi decoder and a backward ACS when said reconfigurable decoder is emulating a turbo decoder.

9. The reconfigurable decoder of claim 1, wherein:
   said plurality of decoder processing elements includes at least one of each of the following:
   a branch metric unit to calculate branch metrics using information received at an input thereof;
   a branch metric memory to store calculated branch metrics;
   a forward add-compare-select (ACS) to perform forward ACS functions using branch metrics stored in said branch metric memory;
   a forward/backward ACS to perform at least one of forward ACS functions and backward ACS functions using branch metrics stored in said branch metric memory;
   a path metric memory to store path metrics output by at least one of said forward ACS and said forward/backward ACS;
   a traceback unit to store state information for various selected paths in a trellis and to perform a traceback operation using said state information to identify a most likely path through said trellis and corresponding data represented thereby; and
   log likelihood ratio (LLR) unit to generate log likelihood ratios based on information output by said forward ACS and said forward/backward ACS.

10. The reconfigurable decoder of claim 9, wherein:
    said plurality of decoder processing elements includes both said traceback unit and said LLR unit, wherein said Viterbi-turbo controller disables said LLR unit when said desired decoder type is a Viterbi decoder and disables said traceback unit when said desired decoder type is a turbo decoder.

11. A Viterbi-turbo decoding system, comprising:
    at least two reconfigurable Viterbi-turbo decoder modules;
    an input processor to segment a higher data rate input stream into multiple lower data rate streams for delivery to inputs of said at least two reconfigurable Viterbi-turbo decoder modules, wherein said at least two reconfigurable Viterbi-turbo decoder modules operate in parallel to process respective one of said multiple lower data rate streams; and
    a combiner to assemble outputs of said at least two reconfigurable Viterbi-turbo decoder modules into a single output stream.

12. The Viterbi-turbo decoding system of claim 11, wherein:
    said at least two reconfigurable Viterbi-turbo decoder modules includes a first reconfigurable Viterbi-turbo decoder module comprising:
    a plurality of decoder processing elements; and
    a Viterbi-turbo controller to deliver configuration information to said plurality of decoder processing elements to achieve a desired decoder type;
    wherein said first reconfigurable Viterbi-turbo decoder module can emulate one or more Viterbi decoder types and one or more turbo decoder types based on a current configuration.

13. The Viterbi-turbo decoding system of claim 11, wherein:
    said input processor is programmed to perform data permutations on said higher data rate input stream, before segmentation, when said at least two reconfigurable Viterbi-turbo decoder modules are configured to perform turbo decoding.

14. The Viterbi-turbo decoding system of claim 11, wherein:
    said combiner is controlled by said input processor.

15. The Viterbi-turbo decoding system of claim 11, wherein:
    said input processor is programmed to provide data overlap between said multiple lower data rate streams.

16. A communication device comprising:
at least one dipole antenna;
a wireless receiver coupled to said at least one dipole antenna; and
a reconfigurable decoder to decode receive data output by said wireless receiver, said reconfigurable decoder including:
   a plurality of decoder processing elements; and
   a Viterbi-turbo controller to deliver configuration information to the plurality of decoder processing elements to achieve a desired type of decoder;

wherein said reconfigurable decoder can emulate one or more Viterbi decoder types and one or more turbo decoder types based on a current configuration;

wherein said configuration information includes parameters to control routing of branch metrics to individual ACS units and parameters to describe a predetermined puncture pattern.

17. The communication device of claim 16, wherein:

said Viterbi-turbo controller is programmed to determine said desired type of decoder based on a signal type detected by said wireless receiver.

18. The communication device of claim 16, wherein:

said plurality of decoder processing elements includes at least one programmable logic array (PLA).

* * * * *